(12) United States Patent
Lange

(10) Patent No.: US 9,081,032 B2
(45) Date of Patent: Jul. 14, 2015

(54) CAPACITIVE SENSOR ARRANGEMENT FOR SWITCHING A DOOR OPENING ON A MOTOR VEHICLE

(75) Inventor: Stefan Lange, Heiligenhaus (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 218 days.

(21) Appl. No.: 13/880,639

(22) PCT Filed: Aug. 29, 2011

(86) PCT No.: PCT/EP2011/064835
§ 371 (c)(1),
(2), (4) Date: May 22, 2013

(87) PCT Pub. No.: WO2012/052210
PCT Pub. Date: Apr. 26, 2012

(65) Prior Publication Data
US 2013/0234733 A1    Sep. 12, 2013

(30) Foreign Application Priority Data

Oct. 22, 2010    (DE) .................. 10 2010 060 122

(51) Int. Cl.
*G01R 27/26*    (2006.01)
*G01R 1/02*    (2006.01)
*B60R 25/20*    (2013.01)
*B60R 25/24*    (2013.01)
*H03K 17/955*    (2006.01)
*E05F 15/00*    (2015.01)
*E05F 15/73*    (2015.01)

(52) U.S. Cl.
CPC .............. *G01R 1/02* (2013.01); *B60R 25/2045* (2013.01); *B60R 25/2054* (2013.01); *B60R 25/246* (2013.01); *H03K 17/955* (2013.01); *E05F 15/00* (2013.01); *E05F 15/73* (2015.01); *E05Y 2400/852* (2013.01); *E05Y 2400/858* (2013.01); *E05Y 2900/546* (2013.01); *H03K 2217/94052* (2013.01); *H03K 2217/96078* (2013.01)

(58) Field of Classification Search
CPC .... G01R 1/02; B60R 25/2045; H03K 17/955; E05F 15/00
USPC ............... 324/658–663, 600, 612, 500, 76.11
See application file for complete search history.

(56) References Cited

U.S. PATENT DOCUMENTS

| 5,730,165 A | 3/1998 | Philipp |
| 6,825,752 B2 | 11/2004 | Nahata et al. |
| 2012/0319502 A1* | 12/2012 | Van Gastel ................. 307/116 |
| 2014/0049505 A1* | 2/2014 | Radivojevic et al. ......... 345/174 |

FOREIGN PATENT DOCUMENTS

| DE | 101 31 243 C1 | 11/2002 |
| DE | 10 2005 032 402 B3 | 9/2006 |
| DE | 196 81 725 B4 | 4/2007 |
| DE | 10 2006 044 778 A1 | 3/2008 |
| DE | 10 2008 063 366 A1 | 7/2010 |
| EP | 0 518 836 A1 | 12/1992 |
| EP | 0 770 749 A2 | 5/1997 |
| EP | 1 339 025 A1 | 8/2003 |
| EP | 2 159 362 A1 | 3/2010 |

OTHER PUBLICATIONS

International Search Report of International Application No. PCT/EP2011/064835, dated Oct. 28, 2011.
International Preliminary Report on Patentability of International Application No. PCT/EP2011/064835, dated Feb. 19, 2013 (with English translation).

* cited by examiner

Primary Examiner — Melissa Koval
Assistant Examiner — Trung Nguyen
(74) Attorney, Agent, or Firm — Fay Sharpe LLP

(57) ABSTRACT

A sensor arrangement for sensing movement gestures on a motor vehicle with a capacitive sensor arrangement and at least one control and evaluation device which is coupled to the sensor arrangement and which senses a change in the capacitance of the sensor arrangement with respect to a reference potential. A user can use a part of his body, for example his foot, to make a gesture in the sensing range of the sensors for activating a tailgate. At least two sensor electrode arrangements are arranged at spatially offset positions on the motor vehicle. The sensor electrodes are embodied as elongate electrode arrangements and are arranged with the same spatial orientation. One of the sensor electrodes is longer than the other. The relatively long sensor electrode extends beyond the relatively short sensor electrode on both sides in the longitudinal direction.

9 Claims, 4 Drawing Sheets

CAPACITIVE SENSOR ARRANGEMENT FOR SWITCHING A DOOR OPENING ON A MOTOR VEHICLE

The invention relates to a capacitive sensor arrangement having a sensor electrode, with the aid of which the entry of an object into a space in front of the sensor electrode is to be detected, a control and evaluation circuit which is coupled to the sensor electrode and detects a change in the capacitance of the sensor electrode with respect to a reference potential. This can take place in that it periodically charges and discharges the sensor electrode at a predefined frequency and evaluates at least one parameter of a current or voltage profile which depends on the periodic charging and discharging of the sensor electrode in order to detect the change in capacitance.

A capacitive sensor arrangement having a sensor electrode, with the aid of which the approach of an object is to be detected, and having a control and evaluation circuit which is coupled to the sensor electrode and detects a change in the capacitance of the sensor electrode with respect to earth by periodically repeatedly coupling the sensor electrode with an operating voltage at a predefined frequency and evaluating at least one parameter of a current or voltage profile which depends on the periodic charging and discharging of the sensor electrode in order to detect the change in capacity, is for example known from U.S. Pat. No. 5,730,165 or from the corresponding patent document DE 196 81 725 B4. The parameter of a current or voltage profile which depends on the periodic charging and discharging of the sensor electrode is a voltage which can be measured by means of a capacitor, which depends on the charge accumulated on the capacitor, this charge being accumulated by the sensor electrode being periodically, repeatedly charged by coupling with the operating voltage and then discharged by means of the capacitor by coupling with the same. Another such capacitive sensor is known from patent document EP 1 339 025 B1.

A capacitive sensor arrangement having a sensor electrode, having an earth background electrode, which is arranged behind the sensor electrode, and having a guard electrode, which is arranged between the sensor electrode and the earth background electrode and which is coupled to the sensor electrode by means of a control and evaluation circuit in such a manner that its potential tracks the potential of the sensor electrode, is known for example from the publications EP 0 518 836 A1, U.S. Pat. No. 6,825,752 B2, DE 101 31 243 C1 and DE 10 2006 044 778 A1. The provision of a guard electrode between the sensor electrode and the background electrode at earth potential known from these documents has the advantage that the sensitivity of the capacitive sensor formed in this manner to changes in the space in front of the sensor electrode, for example owing to the introduction of objects, is increased. This is because of the fact that the field emanating from the sensor electrode extends further in the space in front of the sensor electrode (detection region) because a large part of the field for the background electrode at earth potential is no longer short-circuited, as is the case if there is no guard electrode. Because of the fact that the guard electrode is coupled to the sensor electrode in such a manner that it tracks its potential, the strong electric field is produced between the guard electrode and the background electrode; in particular however, virtually no field is formed between the sensor electrode and the guard electrode which is tracked in terms of potential.

The known arrangement of sensor electrode, guard electrode and background electrode is usually enclosed by an electrical insulator, for example a plastic, so that there is an insulator layer, for example plastic layer, on the sensor electrode and thus between the sensor electrode and the space to be monitored in front of the sensor electrode, that is, the detection region.

Such sensor electrodes can be used to operate a door of a motor vehicle, e.g. the tailgate. To this end, sensor electrodes can be used which detect the approach of a body part, e.g. a pivoting movement of a leg under the bumper and forward it in a command to open or close the tailgate to a control device in the motor vehicle.

A problem with the known devices consists in that incorrect detections can occur, which trigger undesired switching or operating processes if movements of objects are misinterpreted by the sensor system.

The object of the invention is therefore to provide a reliable sensor system which reduces incorrect detections of operating requirements.

According to the invention, this object is achieved by a capacitive sensor arrangement having the features of Claim 1.

The capacitive sensor arrangement according to the invention comprises first and second sensor electrodes which extend along a first co-ordinate line and with the aid of which the entry of an object into a space in front of the sensor electrodes is to be detected. The co-ordinate line is for example a straight co-ordinate line of a Cartesian co-ordinate system; it can however also be curved in the space. One sensor electrode arrangement is arranged offset with respect to the other, e.g. in a lower or higher region of the bumper.

The capacitive sensor arrangement also has a control and evaluation circuit which is coupled to the sensor electrodes and detects a change in the capacitance of the sensor electrodes with respect to a reference potential. This detection can take place in that it periodically charges and discharges the sensor electrodes at a predefined frequency and evaluates at least one parameter of a current or voltage profile which depends on the periodic charging and discharging of the first sensor electrode in order to detect the change in capacitance. It carries out the periodic charging and discharging for example by periodically repeatedly coupling the sensor electrode to a predefined potential, for example the operating voltage potential, at the predefined frequency. The voltage profile can for example be the voltage profile at the connection of the first sensor electrode. The parameter can for example be a voltage which is measured by means of a capacitor which accumulates a charge or a certain number of periods of the charging and discharging until a switching threshold is exceeded by a voltage measured at the first sensor electrode.

According to the invention, at least one of the sensor arrangements is formed with a greater longitudinal extent than the at least one further sensor electrode arrangement. The longer sensor arrangement then projects over the shorter one on both sides of the longitudinal extent of the shorter sensor electrode arrangement.

The sensor electrode arrangements are e.g. arranged in a rear bumper to monitor the region behind the bumper and under the bumper. The signal patterns of the first sensor electrode and of the further sensor electrode arrangement are scanned repeatedly (e.g. in reaction to the detection of an ID transmitter of a keyless entry system).

A predefined gesture of a user, e.g. a simulated kick under the bumper, should result in an opening or closing process. For this, the signal sequences of the sensor electrodes are detected and compared with signal sequences which indicate a targeted operation of the device.

The configuration of the sensor electrodes with significantly different longitudinal extents makes it possible to ensure increased detection accuracy in the error-critical lateral regions.

The arrangement according to the invention extends the detection region of an electrode arrangement beyond the detection region of the other electrode in the direction of the longitudinal extent. A spatially inhomogeneous detection profile of the electrodes, which can be evaluated, is formed in this region, in which the sensitivity of the shorter electrode fades but the sensitivity of the longer electrode remains the same.

The detection region of the shorter electrode arrangement is concentrated more on the common longitudinal region spanned by both electrode arrangements in correspondence with the smaller physical extent. In the lateral regions, the longer sensor electrode is mainly or even exclusively sensitive. As the position of the electrodes on the vehicle is known, the signals of the electrodes can be differentiated better in this manner. If e.g. a signal change is detected first or only on the longer electrode, this indicates a non-targeted trigger. The desired detection region lies within the region of the common longitudinal extent which is spanned by both electrodes. An identical shortening of both electrodes is not helpful in this respect, because although it reduces the detection region, it does not allow differentiation in the edge regions.

The device according to the invention allows different types of evaluation, by means of the signal strength of both electrodes and by means of the signal sequence. It can in particular be monitored whether the longer electrode responds to a change in state first, which indicates a non-targeted boundary event. A further differentiation can also be carried out by means of the spatial arrangement, as described below. The overhang of the electrodes on both sides can be symmetrical, but this is not strictly necessary.

The difference in length between the sensor electrode arrangements is preferably 5%-30%. Such a difference in length ensures that there is a clear overhang, which also results in clear signal differences. There is also a percentually predominant portion of a common extent region, which allows detection e.g. of movement gestures in this region.

It is advantageous if the sensor electrode arrangement of shorter length is arranged at a shorter distance in a direction transverse to its longitudinal extent from a detection region which is monitored by the sensor electrode arrangements than the sensor electrode arrangement of longer length.

The arrangement of the shorter electrode closer to the detection region ensures that a reliable chronological query can take place as to whether this electrode detects an approach or change in state first. If this is the case, the approach comes from a target region for valid approaches. If, however, the longer electrode with greater lateral extent detects an approach first, although it is arranged at a greater distance (measured transversely to the longitudinal extent) from the desired detection region, this reliably indicates a non-targeted and invalid approach for triggering the function on the motor vehicle.

In a development of the invention, of the capacitive sensor arrangements, at least one sensor electrode arrangement is formed as a segmented sensor electrode arrangement. This sensor electrode arrangement is connected to the same or a corresponding separate control and evaluation circuit for charging and detection. The segmented sensor electrode arrangement has regions with different capacitive sensitivity along its extent or is formed of alternating sections of several electrodes. This means that the segmented sensor electrode arrangement allows different detection along the sensor electrode depending on position. A body part which is moved along the first sensor electrode produces signals which can be detected in a correspondingly different manner depending on position at the second sensor electrode arrangement, whereas the signals in the first sensor electrode remain the same as long as the distance of the body part from the electrode does not change. This device therefore allows the detection of a movement along the segmented electrode arrangement by repeated querying of this segmented electrode arrangement. If changed signal values occur at the segmented sensor electrode on repeated querying, this indicates a movement along the electrode arrangement. Movements which represent an operating gesture can thereby be distinguished more reliably from other movements.

The segmented electrode arrangement can be formed as a continuous electrode with segmented insulation or shielding (e.g. coaxial cable with shielding which is removed in a segmented manner). Alternatively, a plurality of segments of separately controlled and queried electrode sections can be arranged in a line or offset segment by segment. The number of segments is at least two, but has no upper limit. Both the shorter and the longer of the sensor electrode arrangements can be formed as a segmented electrode arrangement.

In one design of the device according to the invention, the first sensor electrode is queried as to whether the chronological signal pattern is characteristic of a targeted operation approach or movement gesture, in the above example therefore detects an approach of the lower leg of a user and results in increasing signal values. At the same time, the further sensor arrangement is queried, which also detects a movement along the longitudinal axis of the arrangement in addition to an approach owing to its segmented configuration. If they are for example electrode segments of a few cm in length, a rapid change of the signal strengths (either owing to segmented shielding or owing to the querying of segmented electrode sections) indicates a movement along the longitudinal axis. A gesture which would for example be caused by a child kicking a ball behind the vehicle while playing or by an animal can thereby be filtered out.

The essential feature is that the segmented electrode arrangement allows a change in position of the detected body along the extent of the arrangement to be recognised by repeated signal querying. If the segmented electrode arrangement is formed from three different electrodes with alternating segments (in the schema -1-2-3-1-2-3- etc.), it is even possible to recognise the direction of the movement.

It is also possible to provide a plurality of segmented sensor arrangement or to form the first sensor electrode likewise as a segmented sensor arrangement.

In a preferred design, the segmented sensor arrangement consists of an elongate, continuous conductor, which has regions with different shielding which alternate section by section.

Such sensor electrodes are particularly simple to produce, as it is merely a case of removing the insulation or shielding (e.g. web in coaxial cables) from commercially available cables. Moreover, a wire can also be used, which is provided in a holder with alternating shielding in the direction of the longitudinal extent. The wire then obtains its segmented property as a sensor arrangement by being introduced into the holder with different shielding effect by segment.

In a further design, the segmented sensor arrangement consists of two sensor electrodes which run segment by segment at a different distance from the detection region or are provided with opposing shielding. Such an arrangement can for example be realised by phase-offset winding of a rod through two separate sensor electrodes. The electrodes run in an alternating manner at a different distance and with different shielding (alternating between in front of the rod and behind the rod) in the longitudinal direction.

In a preferred embodiment, the segmented sensor arrangement is formed from three separately queried sensor electrodes with alternating sections.

In addition to the detection of an approach, such an arrangement also allows detection of the movement direction in front of the sensor electrode arrangement. To this end, the sequence of the sensor signals is detected and the running direction of a signal maximum is determined.

Advantageous and/or preferred embodiments are characterised in the subclaims.

The invention is now explained in more detail using the attached figures.

FIG. 3b shows a schematic signal profile when a longitudinal movement is detected with a sensor arrangement of FIG. 3a;

FIG. 4b shows a schematic signal profile when a longitudinal movement is detected with a sensor arrangement of FIG. 4a.

Figure 1A:
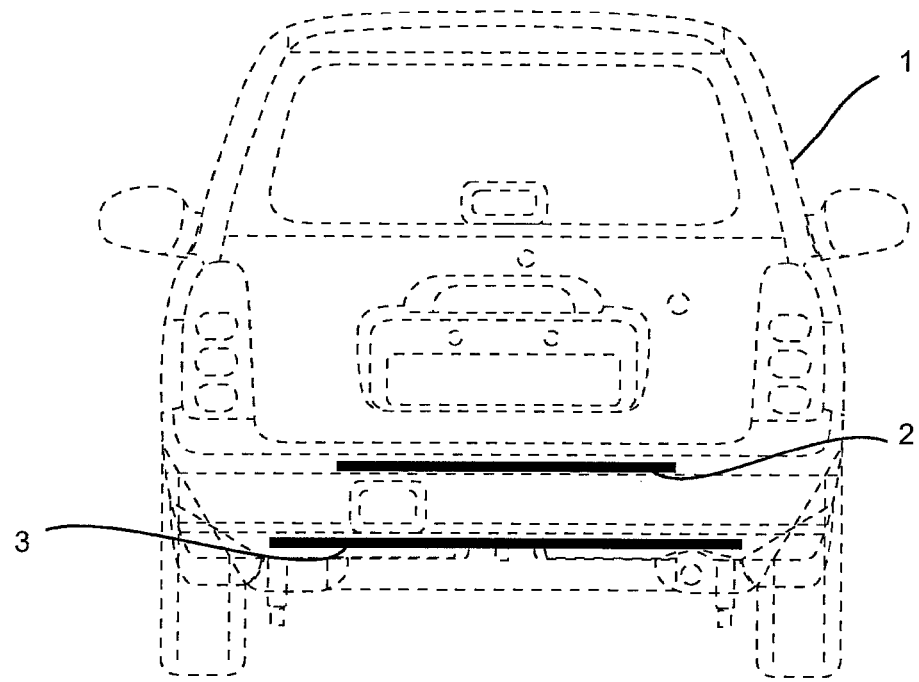
FIG. 1a shows the arrangement of a first embodiment of the sensor arrangement according to the invention on a motor vehicle.
Figure 1B:
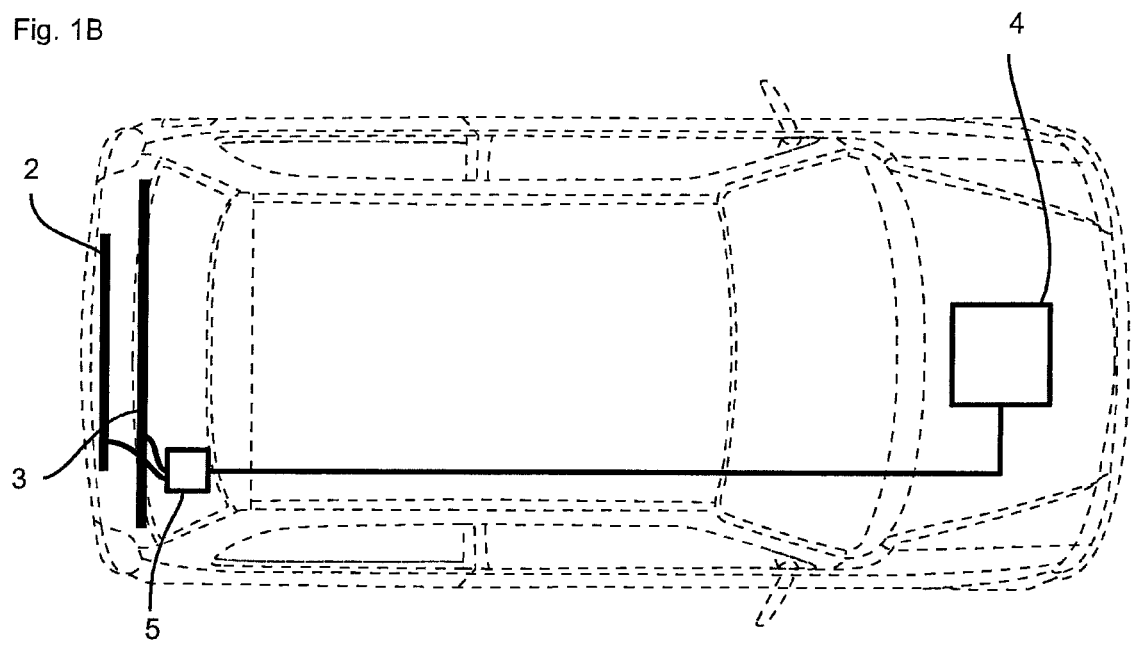
FIG. 1b shows the arrangement of FIG. 1 in a schematic view.
Figure 2:
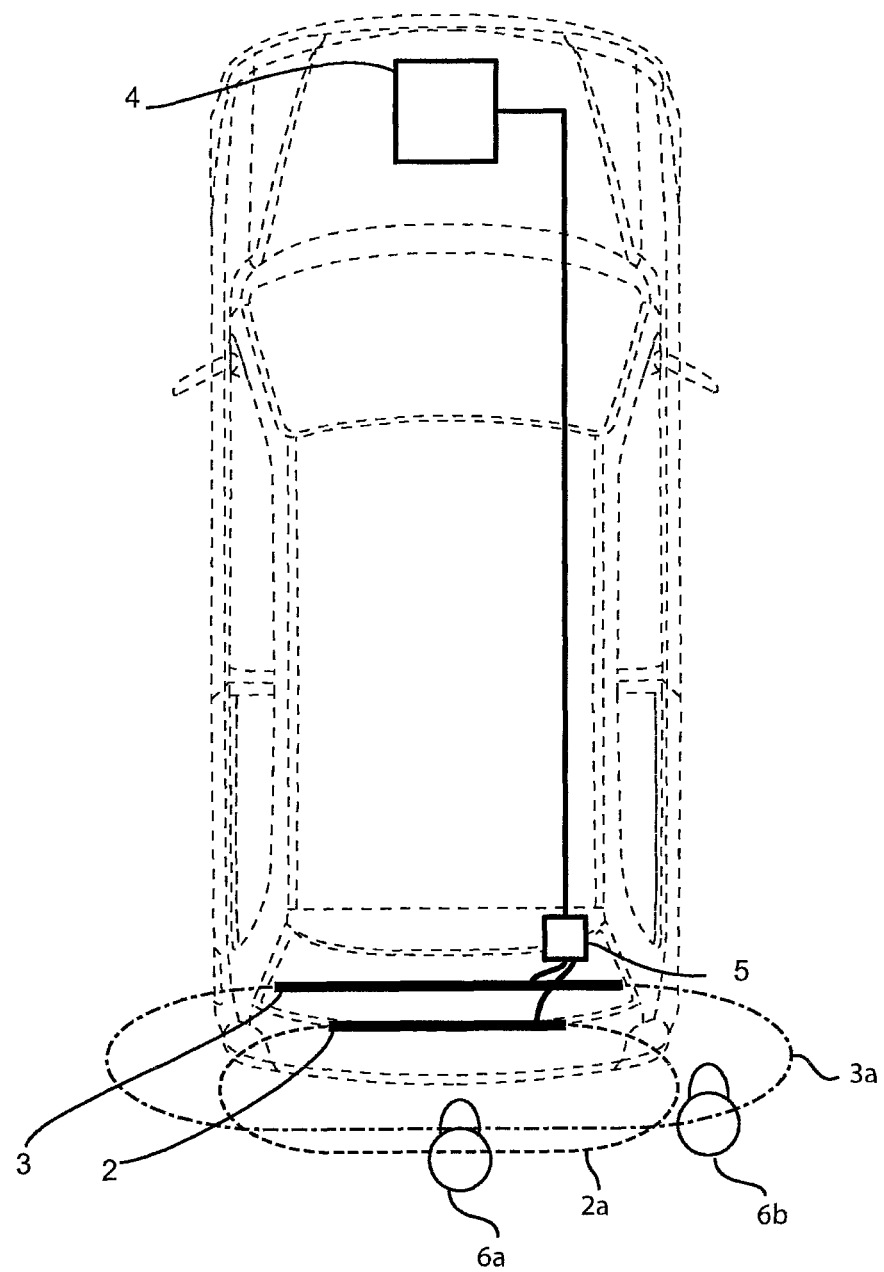
FIG. 2 shows the arrangement of FIG. 1 in a schematic view showing the detection regions.

FIG. 1a shows the rear of a vehicle 1. A sensor electrode arrangement 2 is attached to the region of the rear bumper. A further sensor electrode 3 is arranged below the sensor electrode arrangement 2 (that is, at a lower height above the ground). The sensor electrodes 2 and 3 are each connected to a control and evaluation device 5. This is in turn coupled to a central vehicle control unit 4, which checks and releases an opening of the tailgate of the vehicle. The electrodes are charged by means of the device 5 and the change in capacitance of the electrodes when a body, e.g. a body part of a user, approaches can be detected by evaluating the charge. This principle of a capacitive sensor is known in the field of motor vehicle technology.

The sensor electrode arrangement 3 runs substantially parallel to the electrode 2. The electrode arrangement 3 however extends longer than the electrode arrangement 2 and projects laterally over the ends of the electrode 2. The electrodes 2 and 3 are in this case continuous with substantially uniform sensitivity. One or both of the electrodes could however also be formed as segmented electrodes, the detection sensitivity of which varies in the longitudinal direction, that is, has regions with alternating detection sensitivity in the direction of the extent of the bumper. Such an electrode arrangement 2 could then detect both an approach (by an absolute change in the detected signal) and a movement of a body along the segments. If the body lies in front of the sensor electrode in such a manner that more segments or larger sections with greater detection sensitivity lie behind the body than segments with lower detection sensitivity, the signal determined is higher than in the case where the body is arranged in front of the sensor electrode in such a manner that more segments or greater sections with lower detection sensitivity lie behind the body than segments with greater detection sensitivity. If the body moves along the arrangement, this is recognised by a signal fluctuation which can be measured with the evaluation unit. The segments should be matched in terms of their length to the desired detection accuracy, they can each have a length of e.g. 5 cm to 30 cm.

However, as the segmentation is not essential to the invention, the example is described with two continuous homogeneous electrodes. The design of a segmented electrode which further increases the evaluation possibilities is described below by way of example.

If a user wishes, a user can for example move his/her lower leg in a pivoting movement under the bumper. This movement and approach is detected both by the electrode arrangement 2 and by the extended sensor electrode 3, as the change in capacitance is repeatedly queried over time and the change is evaluated.

Because of the different lengths of the electrodes, their detection regions also extend to a different extent laterally. As shown in FIG. 1c, the electrode 3 has a detection region 3a, while the electrode 2 has a narrower detection region 2a. Two stylised lower legs 6a and 6b are shown to illustrate the different detection positions. The lower leg 6a is situated in the detection region 2a and further in, in the set back detection region 3a. The lower leg 6b however is exclusively in the detection region 3a.

An opening command is generated by the central control device 4 only when the electrode arrangement 2 first registers an operation during chronological querying. Only a gesture which is executed behind the vehicle and directed towards the vehicle should be interpreted as an opening command. Accordingly, all of the detected signals are evaluated in order to allow reliable interpretation of an opening gesture.

Signal profiles which indicate entry of a user body part into the region 3a first (or only) are discarded by the detection device 5 at this stage. If, however, a plausible chronological sequence is detected (entry first into region 2a and then into 3a), the chronological signal sequence is further analysed to check whether an operating gesture is actually present. To this end, the absolute signal values of the electrodes and their ratio can also be evaluated. The different transverse extent of the electrodes which is present according to the invention increases the differentiation accuracy, in particular in the critical lateral regions.

Further sensor electrode arrangements can also be added to the arrangement.

Figure 3A:
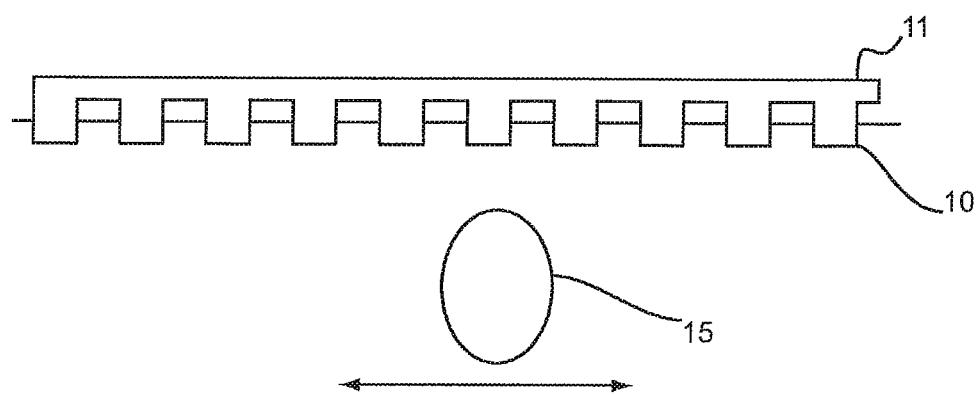
FIG. 3a shows a first segmented sensor arrangement for use in a device according to the invention.

FIG. 3a schematically shows a possible design of a segmented sensor arrangement as can be used in the invention. Each of the above-mentioned electrodes 2, 3 can be formed as segmented electrodes to further refine the evaluation possibilities. This is because there is also a transverse recognition of the movement in addition to the edge sensitivity which is improved according to the invention, as explained above.

In the figure, a sensor electrode 10 is guided in a holder 11 by way of example. The holder 11 encloses the electrode 10 in sections and thus forms segments with more and less shielding.

An object 15 can move in the transverse direction in front of the segmented sensor arrangement. It is then situated in front of more or less shielded regions depending on position. In the above arrangement of the electrodes, in particular electrode 2, which is arranged closer to the user, can be configured as a segmented electrode.

Figure 3B:
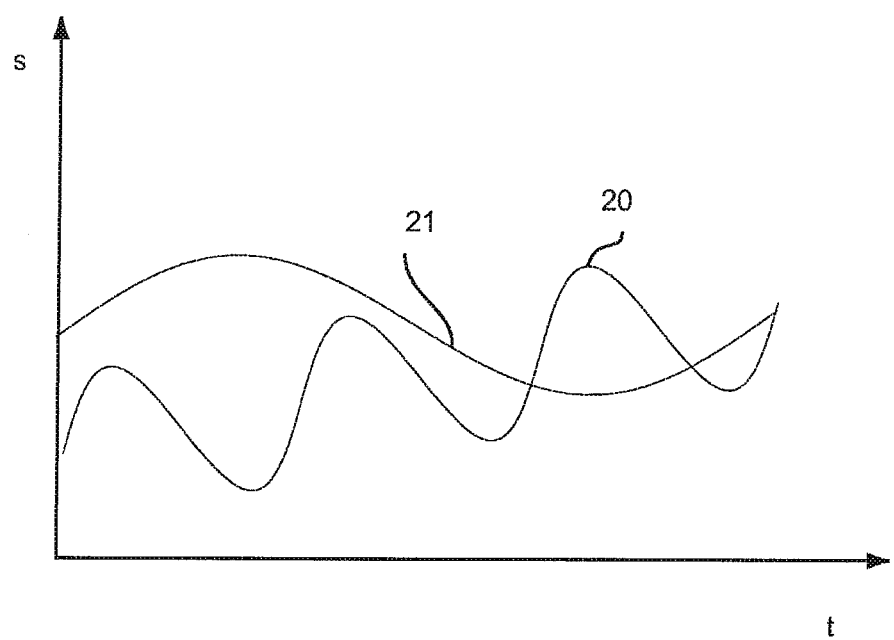

FIG. 3b shows an idealised chronological signal profile for an evaluation of the signal in the case of a uniform movement of the object in front of the arrangement. The central signal strength (or also offset) is defined by the closeness of the object to the sensor arrangement. The variation is however caused by the movement of the object in the longitudinal direction of the arrangement. A signal profile 20 which is caused by a moving object can be differentiated from a profile 21 which is caused by a targeted movement (swinging of the leg towards the sensor arrangement) by suitable empirical evaluation and determination of characteristic values.

In combination with the different lengths of the electrodes, a complex evaluation of the movement gestures executed and a reliable differentiation of random or non-targeted events becomes possible.

Figure 4A:
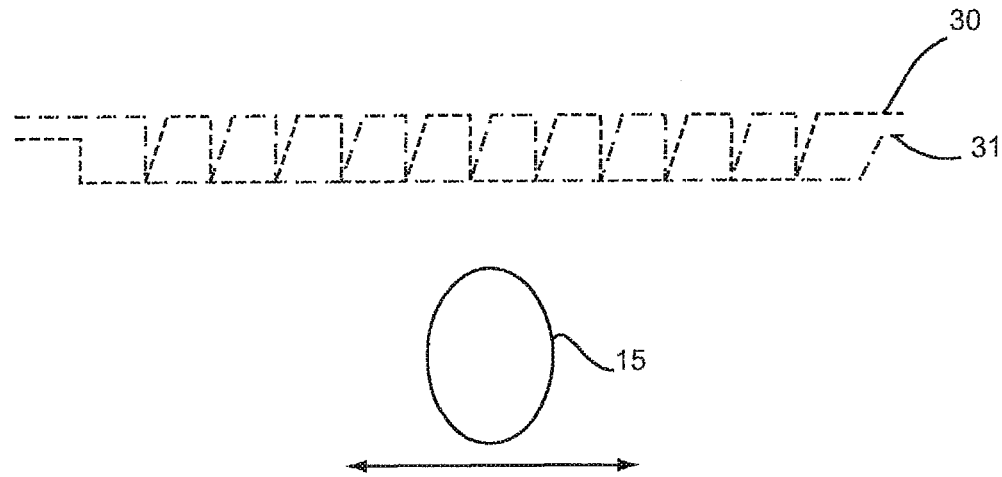
FIG. 4a shows a second segmented sensor arrangement for use in a device according to the invention.

FIG. 4a shows an alternative design of a segmented sensor arrangement having two separate capacitively queried electrodes 30, 31. These are situated section by section at alternating distances from the object 15 to be detected.

Figure 4B:
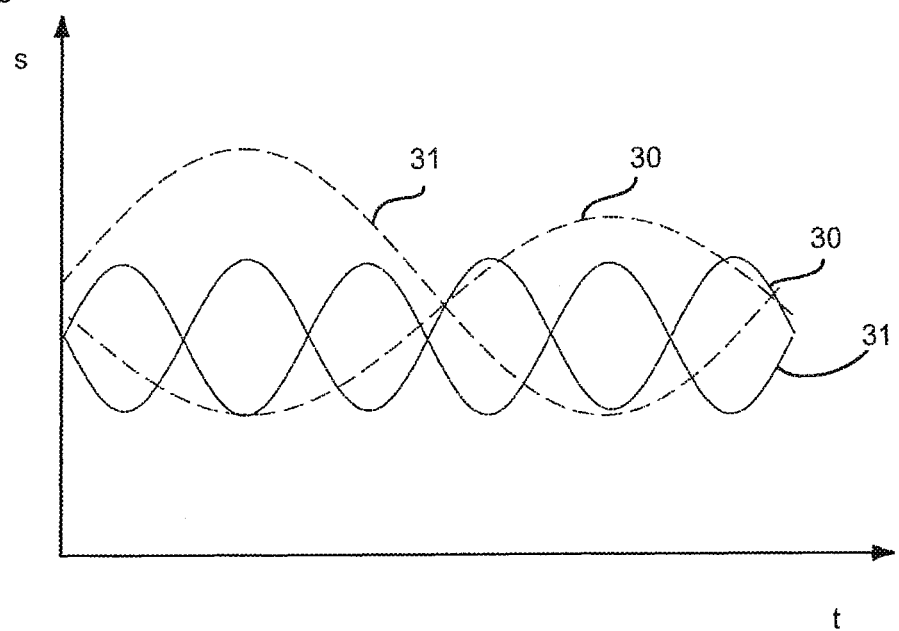

FIG. 4b also shows a signal profile, which in this case reproduces the chronological signals of both electrodes during a transverse movement (solid lines) and a directed operating gesture (dashed). In this case too, the different signal profiles can be clearly distinguished and improve reliability during interpretation of the sensor signals.

The invention claimed is:

1. A sensor arrangement for detecting movement gestures towards a motor vehicle, having a capacitive sensor arrangement and at least one control and evaluation device, which is coupled to the sensor arrangement and detects a change in the capacitance of the sensor arrangement with respect to a reference potential,
   characterised in that
   at least two sensor electrode arrangements are arranged at spatially offset positions on the motor vehicle, wherein the sensor electrodes are formed as elongate electrode arrangements and are arranged with the same spatial orientation,
   wherein one of the sensor electrode arrangements is formed with a longer length than the other sensor electrode arrangement, and the longer sensor electrode arrangement extends beyond the shorter sensor electrode arrangement on both sides in the longitudinal direction,
   wherein at least one of the sensor electrode arrangements is formed as a capacitively detecting first sensor electrode arrangement which is segmented in sections, wherein the segments are arranged in the longitudinal direction and allow different capacitive detection section by section.

2. The sensor arrangement according to claim 1, wherein the length difference of the sensor electrode arrangements is 5%-30%.

3. The sensor arrangement according to claim 1, wherein the sensor electrode arrangement of shorter length is arranged at a shorter distance in a direction transverse to its longitudinal extent from a detection region which is monitored by the sensor electrode arrangements than the sensor electrode arrangement of longer length.

4. The sensor arrangement according to claim 1, wherein the segmented first sensor electrode arrangement is formed by a shielding of a sensor electrode which is different section by section in the longitudinal direction.

5. The sensor arrangement according to claim 1, wherein the segmented first sensor electrode arrangement is formed by the alternating longitudinal arrangement of at least two sensor electrodes which can be activated separately.

6. The sensor arrangement according to claim 1, wherein each sensor electrode arrangement can be queried by the evaluation device in order to detect a chronological signal profile.

7. The sensor arrangement according to claim 1, wherein a third sensor electrode arrangement is formed from a homogeneous sensor electrode and is arranged offset to the first two sensor electrode arrangements.

8. The sensor arrangement according to claim 1, wherein a plurality of sensor electrode arrangements are formed as segmented sensor electrode arrangements.

9. The sensor arrangement according to claim 1, wherein at least the segmented first sensor electrode arrangement is arranged in a bumper of a motor vehicle.

* * * * *